United States Patent [19]

Ohya et al.

[11] Patent Number: 5,121,011
[45] Date of Patent: Jun. 9, 1992

[54] DRIVER CIRCUIT FOR DRIVING AN ANALOG DEVICE

[75] Inventors: Eiji Ohya, Anjou; Sachito Horiuchi, Seto; Toshio Hanazawa, Kasugai, all of Japan

[73] Assignees: Fujitsu Limited, Kawasaki; Fujitsu VLSI Limited, Kasugai, both of Japan

[21] Appl. No.: 708,879

[22] Filed: May 31, 1991

[30] Foreign Application Priority Data

May 31, 1990 [JP] Japan .................. 2-142183
Mar. 20, 1991 [JP] Japan .................. 3-55240

[51] Int. Cl.$^5$ .................. H03K 17/60; H03K 19/02; H03K 3/26; H03K 5/13
[52] U.S. Cl. .................. 307/570; 307/446; 307/254; 307/315; 307/602; 307/605; 307/270
[58] Field of Search .................. 307/570, 270, 446, 451, 307/254, 315, 573, 602, 605

[56] References Cited

U.S. PATENT DOCUMENTS 5,006,732  4/1991  Nakamura .................. 307/570
5,038,058  8/1991  Wang .................. 307/570

FOREIGN PATENT DOCUMENTS

60-165117   8/1985  Japan .
63-283230  11/1988  Japan .
2-153619    6/1990  Japan .

Primary Examiner—Stanley D. Miller
Assistant Examiner—Trong Phan
Attorney, Agent, or Firm—Staas & Halsey

[57] ABSTRACT

An output circuit comprises first and second transistors connected in series between a first voltage source and an second voltage source such that the first and second transistors are turned on and turned off respectively in response to an input logic signal and a logic inversion thereof, third and fourth transistors connected in series between a third voltage source and fourth voltage source such that the third and fourth transistors are turned on and turned off respectively in response to the logic inversion of the input logic signal and the input logic signal, first and second power transistors connected in series between a fifth voltage source and a sixth voltage source such that the first power transistor is turned on in response to the turning-on of the first transistor and turned off in response to the turning-on of the second transistor, the second power transistor is turned on in response to the turning-on of the third transistor and turned off in response to the turning-on of the fourth transistor, wherein there are provided a first drive control circuit for detecting the turning-on of the second power transistor and disabling the turning-on of the first transistor with a delay such that the turning-on of the first transistor is prohibited for a predetermined interval even after the second power transistor is turned on following a turned off state and a second drive control circuit for detecting the turning-on of the first power transistor and disabling the turning-on of the third transistor with a delay such that the turning-on of the third transistor is prohibited for a predetermined time interval even after the first power transistor is turned on following a turned off state.

9 Claims, 10 Drawing Sheets

FIG. 6(D) ON DELAY

FIG. 6(H) ON DELAY ON

DRIVER CIRCUIT FOR DRIVING AN ANALOG DEVICE

BACKGROUND OF THE INVENTION

The present invention generally relates to driver circuits for driving analog devices, and in particular to a high power digital output circuit for producing high power digital signals that drive an analog device such as audio-speaker via a suitable filtering circuit.

The use of digital power amplifiers is spreading for example in the audio amplifiers because of the high quality sound obtained from such digital systems. By using the digital power amplifiers, one can eliminate the analog signal processing from the entire audio system except for the final stage for driving the audio speakers. Thereby, an ideal reproduction or processing of the audio signals is achieved without being hampered by the distortion or noise pertinent to the analog audio systems. Such a digital power amplifier is particularly suited for reproducing the audio signals from the digital signal source such as the digital audio disc players or digital tape recorders that produce the output audio signals in the form of digital data.

Figure 1:
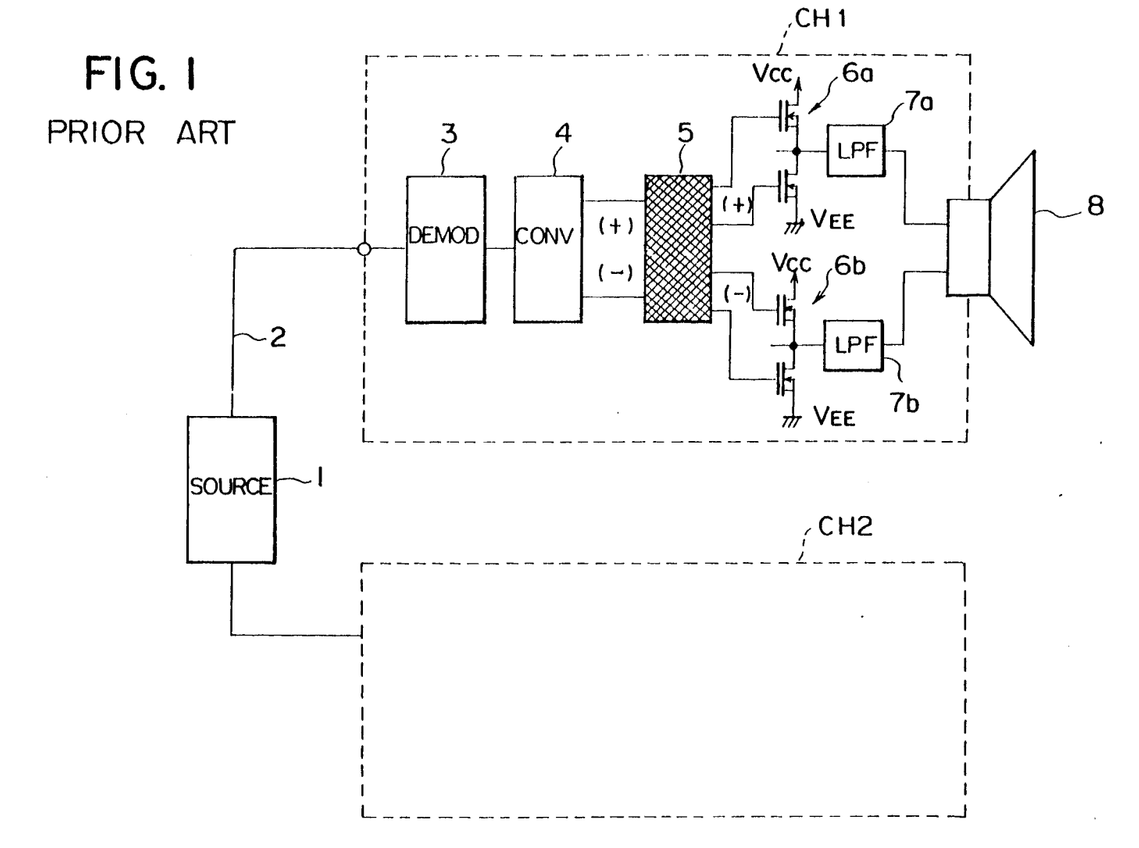
FIG. 1 is a block diagram showing the construction of a digital audio system to which the present invention is applicable.

FIG. 1 shows an example of such a digital audio system.

Referring to FIG. 1, a digital signal source 1 supplies a digital output signal to a demodulator 3 via an optical fiber cable 2. The demodulator 3 reproduces, in response, a pulse code modulation (PCM) signal that is supplied to a converter 4 for conversion to a pulse width modulation (PWM) signal. The converter 4 produces the foregoing PWM signal and a logic inversion thereof simultaneously in correspondence to the PCM signal supplied thereto, and supplies the same to a digital driver circuit 5 that is the subject matter of the present invention. The digital driver circuit 5, in turn, drives output circuits 6a and 6b each comprising a pair of high power MOS transistors connected in series between a voltage source $V_{CC}$ and the ground $V_{EE}$. The output circuits 6a and 6b are driven complementary such that when the circuit 6a produces an output current with a voltage of $V_{CC}$, the output circuit 6b produces a ground level voltage $V_{EE}$, and such that when the circuit 6b produces an output current with the voltage of $V_{CC}$, the output circuit 6a produces the ground level voltage.

The output circuits 6a and 6b drive a speaker 8 via respective low pass filters 7a and 7b that smooths the pulse width modulation signals supplied thereto from the output circuits 6a and 6b. Thereby, a high power amplitude modulation signal of which amplitude changes about a level of $V_{CC}/2$ is obtained at the speaker 8.

Figure 2:
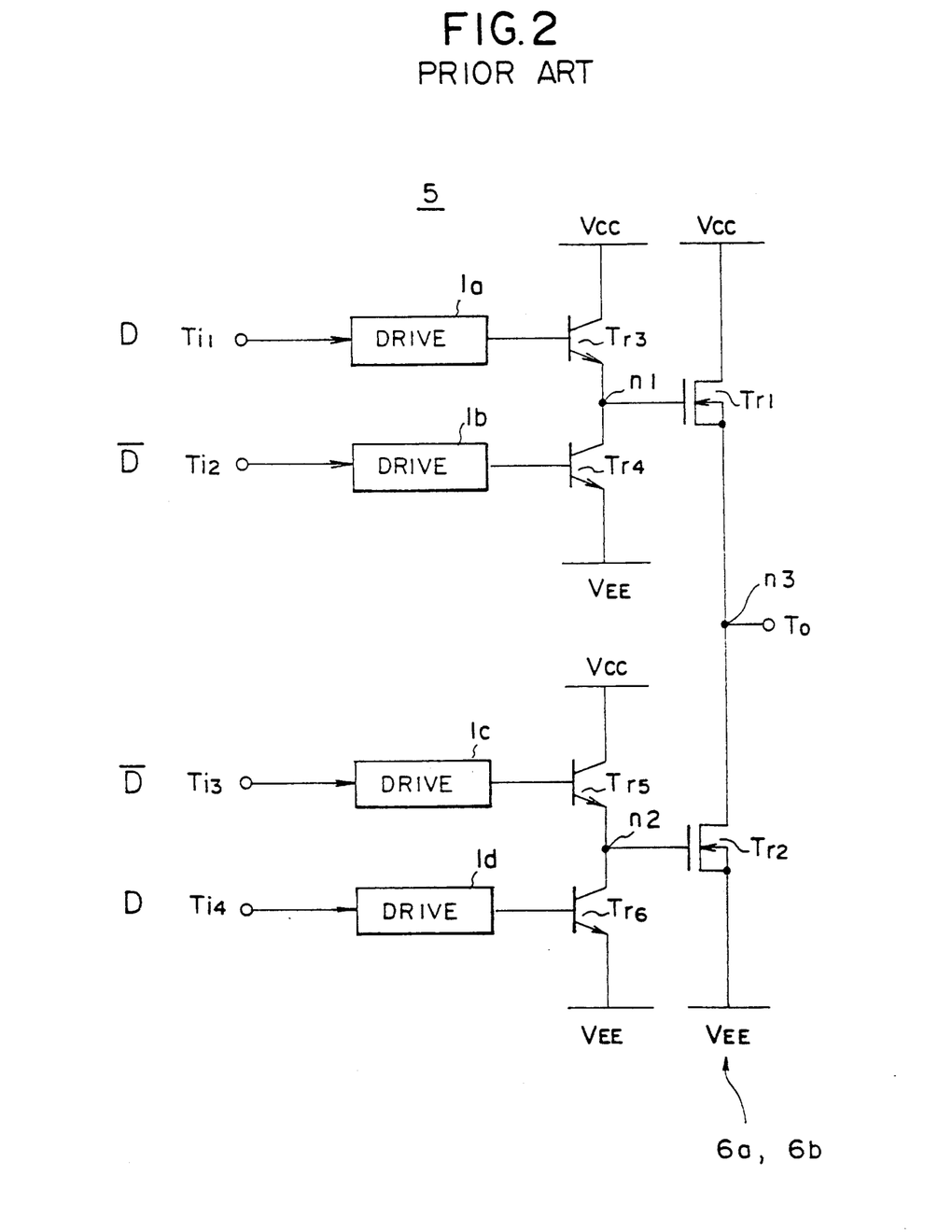
FIG. 2 is a block diagram showing a conventional digital driver circuit that is used in the audio system of FIG. 1.

FIG. 2 shows the construction of the conventional driver circuit 5 including the MOS output circuits 6a and 6b.

Referring to FIG. 2, there are provided drive circuits 1a and 1b respectively connected to input terminals $T_{i1}$ and $T_{i2}$ to which a PWM signal D and its logic inversion $\overline{D}$ are supplied. The drive circuit 1a has an output terminal connected to a base of a bipolar transistor $T_{r3}$, while the drive circuit 1b has an output terminal connected to a base of another bipolar transistor $T_{r4}$. The transistors $Tr_3$ and $Tr_4$ are connected in series between the voltage source $V_{CC}$ and the ground level $V_{EE}$ such that the transistor $Tr_3$ has a collector connected to the voltage source $V_{CC}$ and an emitter connected to a collector of the transistor $Tr_4$. The transistor $Tr_4$, on the other hand, has an emitter connected to the ground $V_{EE}$. Similarly, there are provided drive circuits 1c and 1d respectively connected to input terminals $T_{i3}$ and $T_{i4}$ to which the inverted PWM signal $\overline{D}$ and the non-inverted PWM signal D are supplied respectively, wherein the drive circuit 1c has an output terminal connected to a base of a bipolar transistor $Tr_5$, the drive circuit 1d has an output terminal connected to a base of another bipolar transistor $Tr_6$. The transistors $Tr_5$ and $Tr_6$ are connected in series between the voltage source $V_{CC}$ and a ground level $V_{EE}$ such that the transistor $Tr_5$ has a collector connected to the voltage source $V_{CC}$ and an emitter connected to a collector of the transistor $Tr_6$. On the other hand, the transistor $Tr_6$ has an emitter connected to the ground $V_{EE}$.

The output circuit 6a or 6b includes power MOS transistors $Tr_1$ and $Tr_2$ connected in series between the voltage source $V_{CC}$ and $V_{EE}$ such that the MOS transistor $Tr_1$ has a drain connected to the voltage source $V_{CC}$, a source connected to the drain of the MOS transistor $Tr_2$, while the MOS transistor $Tr_2$ has a source connected to the ground $V_{EE}$. Further, the transistor $Tr_1$ has a gate connected to a node $n_1$ where the emitter of the bipolar transistor $Tr_3$ and the collector of the bipolar transistor $Tr_4$ are connected with each other, the transistor $Tr_2$ has a gate connected to another node $n_2$ where the emitter of the transistor $Tr_5$ and the collector of the transistor $Tr_6$ are connected with each other. The output of the circuit 6a or 6b is obtained from an output terminal $T_0$ that is connected to a node $n_3$ where the source of the transistor $Tr_1$ is connected to the drain of the transistor $Tr_2$.

In this conventional driver circuit 5, the transistors $Tr_3$ and $Tr_4$ are turned on and turned off in the complementary manner in response to the complementary input signals D and $\overline{D}$ such that when the transistor $Tr_3$ is turned on, the transistor $Tr_4$ is turned off and vice versa. Similarly, the transistors $Tr_5$ and $Tr_6$ are turned on and turned off complementary in response to the complementary input signals $\overline{D}$ and D such that when the transistor $Tr_5$ is turned on, the transistor $Tr_6$ is turned off and vice versa. Thus, when the transistor $Tr_3$ is turned on in response to the high level signal at the input terminal $T_{i1}$, the transistor $Tr_4$ is turned off in response to the low level signal at the input terminal $T_{i2}$. Thereby, a high level signal appears at the node $n_1$ and the MOS transistor $Tr_1$ is turned on in response thereto. At the same time to the high level signal at the input terminal $T_{i1}$, there appear a low level signal at the input terminal $T_{i3}$ and a high level signal at the input terminal $T_{i4}$, and the transistor $Tr_5$ is turned off while the transistor $Tr_6$ is turned on. Thereby, a low level signal appears at the node $n_2$, and the transistor $Tr_2$ is turned off in response thereto. Thus, a large output current is obtained at the output terminal $T_0$ When the logic state of the signals at the input terminals $T_{i1}$–$T_{i4}$ is inverted, on the other hand, the transistor $Tr_3$ is turned off, the transistor $Tr_4$ is turned on, the transistor $Tr_5$ is turned on, and the transistor $Tr_6$ is turned off. As a result, the transistor $Tr_1$ is turned off and the transistor $Tr_2$ is turned on. Thereby, the output terminal $T_0$ is grounded and no output current obtained therefrom. By smoothing the PWM output current at the output terminal $T_0$ by the filtering circuits, one obtains the desired output current.

In this conventional driver circuit 5, there exists a problem in that, when the gate voltage of the transistors Tr₁ and Tr₂ is inverted, there may appear a situation where both of the transistors Tr₁ and Tr₂ are turned on momentarily, depending on the characteristic of the transistors Tr₁ and Tr₂. When this occurs, a feed-through current flows from the voltage source $V_{CC}$ to the ground, and such a feed-through current causes a distortion in the reproduced audio signal and increases the power consumption of the amplifier. The distortion in the reproduced audio signal of course deteriorates the quality of the reproduced sound while the problem of increased power consumption causes a serious problem in the battery driven systems such as a portable audio system.

SUMMARY OF THE INVENTION

Accordingly, it is a general object of the present invention to provide a novel and useful digital driver circuit wherein the foregoing problems are eliminated.

Another and more specific object of the present invention is to provide a digital driver circuit for driving an analog device by an analog output signal in response to a digital input signal with a large output power, wherein the distortion in the obtained analog signal is eliminated.

Another object of the present invention is to provide a digital driver circuit for driving an analog device in response to a digital input signal, wherein the power consumption is improved.

Another object of the present invention is to provide a driver circuit for producing a digital power output, comprising first and second power MOS transistors connected in series between first and second voltage sources for producing a digital power output at an output terminal connected to an intermediate node between the first and second power MOS transistors, first and second bipolar transistors connected in series between third and fourth voltage sources with an intermediate node connected to the gate of the first power MOS transistor for driving the same, third and fourth bipolar transistors connected in series between fifth and sixth voltage sources with an intermediate node connected to the gate of the second power MOS transistor for driving the same, a first driver circuit supplied with an input digital data for driving the first bipolar transistor, a second driver circuit supplied with a logic inversion of the input digital data for driving the second bipolar transistor, a third driver circuit supplied with the logic inversion of the input digital data for driving the third bipolar transistor, a fourth driver circuit supplied with the input digital data for driving the fourth bipolar transistor, a first control transistor for disabling the first bipolar transistor selectively in response to an input signal to the fourth bipolar transistor, a second IU control transistor for disabling the third bipolar transistor selectively in response to an input signal to the second bipolar transistor, a first delay circuit for delaying the input signal to the first control transistor, and a second delay circuit for delaying the input signal to the second control transistor. According to the present invention, the simultaneous turning-on of the first and second power MOS transistors is eliminated by disabling the first or third bipolar &transistors with a timing such that the first bipolar transistor remains disabled for a while even when the first driver circuit tries to enable the first bipolar transistor in response to the input data thereto, or such that the third bipolar transistor remains disabled for a while even when the third driver circuit tries to enable the third bipolar transistor in response to the input data thereto. More specifically, there appears a delay when the first and second power MOS transistors are turned on. It should be noted that the first power MOS transistor is turned on by the first bipolar transistor and turned off by the second bipolar transistor. Similarly, the second power MOS transistor is turned on by the third bipolar transistor and turned off by the fourth bipolar transistor. Thereby, the problem of feed-through current flowing through the first and second power MOS transistors is eliminated and the power consumption of the digital driver circuit is improved.

Another object of the present invention is to provide a digital driver circuit for producing a digital power output, comprising first and second power MOS transistors connected in series between first and second voltage sources for producing a digital power output at an output terminal connected to an intermediate node between the first and second power MOS transistors, first and second bipolar transistors connected in series between third and fourth voltage sources with an intermediate node connected to the gate of the first power MOS transistor for driving the same, third and fourth bipolar transistors connected in series between fifth and sixth voltage sources with an intermediate node connected to the gate of the second power MOS transistor for driving the same, a first driver circuit supplied with an input digital data for driving the first bipolar transistor, a second driver circuit supplied with a logic inversion of the input digital data for driving the second bipolar transistor, a third driver circuit supplied with the logic inversion of the input digital data for driving the third bipolar transistor, a fourth driver circuit supplied with the input digital data for driving the fourth bipolar transistor, a first control transistor supplied with the gate voltage of the second power MOS transistor as an input signal for disabling the first bipolar transistor selectively in response thereto, a second control transistor supplied with the gate voltage of the first power MOS transistor as an input signal for disabling the third bipolar transistor selectively in response thereto, wherein the threshold voltages of the first and second control transistors are set lower than the threshold voltage of the first and second power MOS transistors such that the first bipolar transistor is disabled before the second power MOS transistor is turned on, and such that the third bipolar transistor is disabled before the first power MOS transistor is turned on. According to the present invention, the simultaneous turning-on of the first and second power MOS transistors is avoided similarly, and the problem of excessive power consumption of the driver circuit is eliminated.

Other object and further features of the present invention will become apparent from the following detailed description when read in conjunction with the attached drawings.

DETAILED DESCRIPTION

Figure 3:
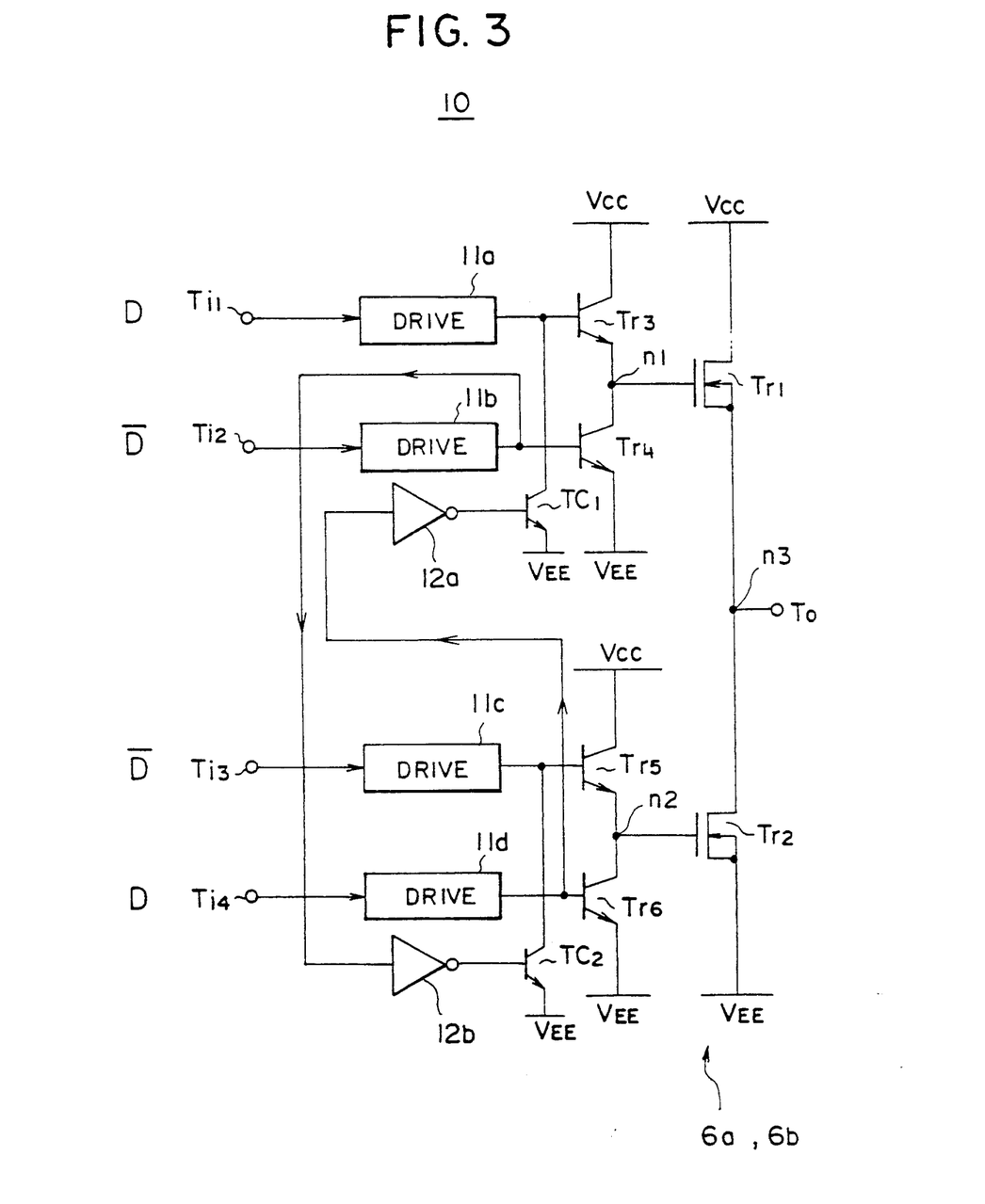
FIG. 3 is a block diagram showing the principle of the present invention according to a first embodiment.
Figure 4:
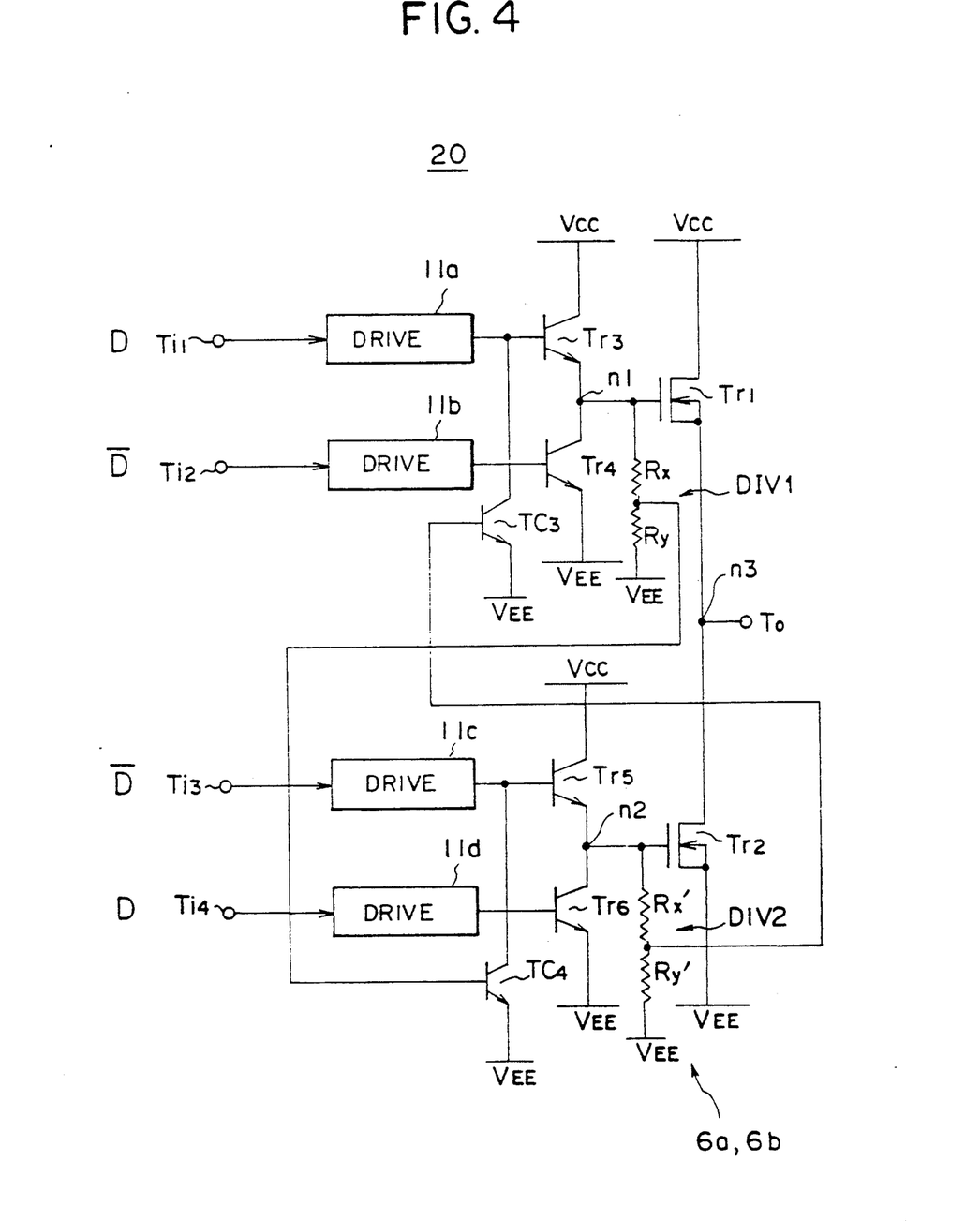
FIG. 4 is another block diagram showing the principle of the present invention according to a second embodiment.

First, the principle of the present invention will be described with reference to FIGS. 3 and 4, wherein FIG. 3 shows the principle for the first embodiment and FIG. 4 shows the principle for the second embodiment.

Referring to FIG. 3 showing the construction that is substantially identical with the construction of FIG. 2, there is provided a first control transistor $TC_1$ that absorbs the base current to the transistor $Tr_3$ when activated. This first control transistor $TC_1$ has a collector connected to the base of the transistor $Tr_3$ and an emitter connected to the ground $V_{EE}$. The transistor $TC_1$ further has a base connected to the base of the bipolar transistor $Tr_6$ via a first inverter circuit $12a$. Thereby, the transistor $TC_1$ is driven in response to the base voltage of the transistor $Tr_6$ with a delay caused by the inverter circuit $12a$. When turned on, the transistor $TC_1$ turns off the transistor $Tr_3$ even when the drive circuit $11a$ has produced an output current for turning on the transistor $Tr_3$. Similarly, there is provided a second control transistor $TC_2$ such that the transistor $TC_2$ has a collector connected to the base of the transistor $Tr_5$ and an emitter connected to the ground $V_{EE}$. The transistor $TC_2$ further has a base connected to the base of the transistor $Tr_4$ via a second inverter circuit $12b$ and is activated in response to the base voltage of the transistor $Tr_4$ with a delay caused by the circuit $12b$. Thereby, when the transistor $Tr_4$ is turned on in response to the output of the drive circuit $11b$, the transistor $TC_2$ disables the transistor $Tr_5$ after a delay caused by the inverter circuit $12b$.

For example, when the logic level of the input data D changes from the high level to the low level, the level of the input signal supplied to the input terminals $T_{i1}$ and $T_{i4}$ changes from the high level to the low level and the level of the input signal supplied to the input terminals $T_{i2}$ and $T_{i3}$ changes from the low level to the high level. In response thereto, the drive circuits $11a$ and $11d$ produce the high level signal while the drive circuits $11b$ and $11c$ produce the low level signal. In response to the low level output of the drive circuit $11b$, the transistor $Tr_4$ is immediately turned off. Similarly, the transistor $Tr_2$ is turned off in response thereto.

On the other hand, the base voltage of the transistor $TC_1$ remains high even after the logic level of the input signals to the input terminals $T_{i1}$–$T_{i4}$ has changed, because of the delay caused by the inverter $12a$. Thereby, the transistor $TC_1$ remains turned on for a while and then turned off. During the interval wherein the transistor $TC_1$ is turned on, the transistor $Tr_3$ is turned off because of the diverting of the base current to the ground via the transistor $TC_1$. Thus, the voltage at the node $n_1$ is held low during this interval and the power MOS transistor $Tr_1$ remains in the turned off state. Only when the transistor $TC_1$ is turned off after the foregoing interval has elapsed, the transistor $Tr_3$ is turned on and the power MOS transistor $Tr_1$ is turned on.

Similarly, the base voltage of the transistor $TC_2$ remains low for a while even after the foregoing transition has occurred in the input signals to the input terminals $T_{i1}$–$T_{i4}$. Only when the interval corresponding to the delay that is caused by the inverter circuit $12b$ has elapsed, the transistor $TC_2$ is turned off. Thereby, the transistor $TC_2$ is turned off and then turned on. However, this operation of the transistor $TC_2$ does not cause substantial change in the operation of the circuit 10, as the transistor $Tr_5$ is turned off in response to the low level input at the input terminal $T_{i3}$. Thus, the voltage level at the node $n_2$ is held at the low level throughout the interval in which the level at the input terminal $T_{i3}$ is low, and the power MOS transistor $Tr_2$ is turned off.

In the foregoing operation, it will be noted that there appears a moment in which both the transistors $Tr_1$ and $Tr_2$ are turned off before the transistor $Tr_1$ is turned on and the output current obtained from the output terminal $T_0$. Thereby, the waste current flowing from the voltage source $V_{CC}$ to the ground $V_{EE}$ is positively prevented.

The above operation holds true also for the case where the level at the input terminals $T_{i1}$ and $T_{i4}$ changes from the high level to the low level and the level at the input terminals $T_{i2}$ and $T_{i3}$ changes from the low level to the high level. As the operation for this case is easily derived from the foregoing explanation, further description will be omitted.

FIG. 4 shows the principle of the second embodiment of which description will be made later in detail.

In this embodiment, the voltage at the node $n_1$ is detected by a control transistor $TC_4$ that has a collector connected to the base of the transistor $Tr_5$ and an emitter connected to the ground. More specifically, there is provided a voltage divider DIV1 connected across the node $n_1$ and the ground, and the transistor $TC_4$ has a base connected to a node of the voltage divider DIV1 wherein a resistor Rx and a resistor Ry are connected with each other. Similarly, there is provided another control transistor $TC_3$ having a collector connected to the base of the transistor $Tr_3$ and an emitter connected to the ground. The transistor $TC_3$ further has a base connected to a voltage divider DIV2 that is connected across a node $n_2$ and the ground. More specifically, the voltage divider DIV2 includes resistors Rx′ and Ry′ that are connected in series between the node $n_2$ and the ground, and the base of the transistor $TC_3$ is connected to a node in the voltage divider DIV2 wherein the resistors Rx′ and Ry′ are connected with each other.

The transistor $TC_3$ has a threshold level that is substantially smaller than the threshold level of the power MOS transistor $Tr_2$ and the transistor $TC_4$ has a threshold level that is substantially smaller than the threshold level of the power MOS transistor $Tr_1$. Thereby, the transistor $TC_3$ is turned on when the power MOS transistor $Tr_2$ is turned on with a timing such that the transistor $TC_3$ is turned on before the transistor $Tr_2$ is turned on. Similarly, when the power transistor $Tr_1$ is turned on, the transistor $TC_4$ is turned on before the transistor $Tr_1$ is actually turned on. In response to the turning on of the transistor $TC_3$, the transistor $Tr_3$ is turned off and the power MOS transistor $Tr_1$ is turned off before the power MOS transistor $Tr_2$ is turned on. Similarly, in response to the turning on of the transistor $TC_4$, the transistor $Tr_5$ is turned off and the power MOS transistor $Tr_2$ is turned off before the power MOS transistor $Tr_1$ is turned on. Thereby, the simultaneous turning on of the power MOS transistors $Tr_1$ and $Tr_2$ is positively prevented and the waste current flowing from the voltage source $V_{CC}$ to the ground is effectively eliminated.

Next, the first embodiment of the present invention will be described in detail with reference to FIG. 5.

Figure 5:
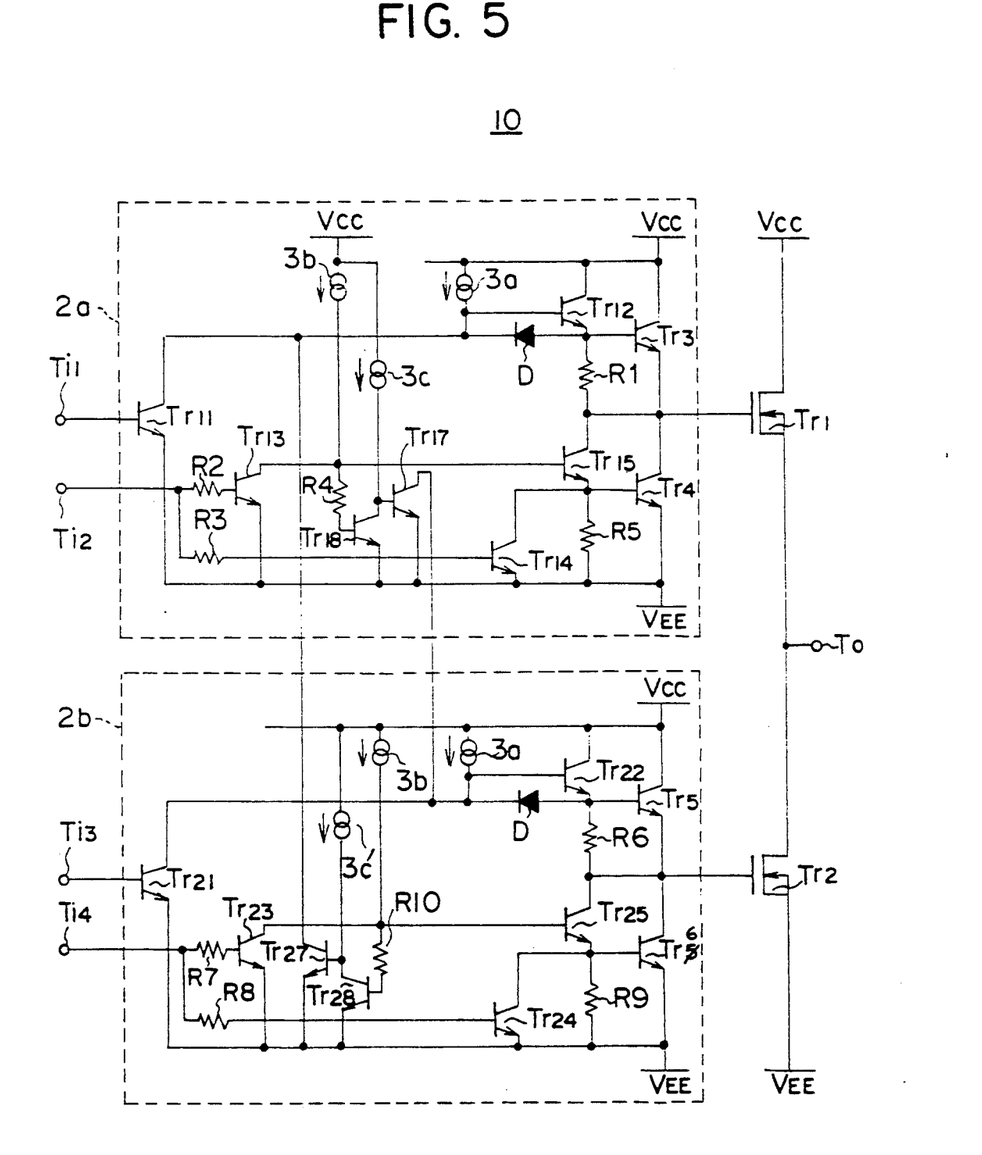
FIG. 5 is a detailed circuit diagram showing the driver circuit according to the first embodiment of the present invention.

Referring to FIG. 5, the drive circuit now represented as a circuit 10 includes a first drive part 2a for driving the power MOS transistor $Tr_1$ and a second drive part 2b for driving the power MOS transistor $Tr_2$. In the first drive part 2a, an input signal D at the input terminal $T_{i1}$ is supplied to a base of an NPN transistor $Tr_{11}$ that has a collector connected to the voltage source $V_{CC}$ via a constant current source 3a and an emitter connected to the ground $V_{EE}$. The transistor $Tr_{11}$ drives the transistor $Tr_3$ via an NPN transistor $Tr_{12}$ that forms a Darlington's pair with the transistor $Tr_3$. There, the transistor $Tr_{12}$ has a base connected to the collector of the transistor $Tr_{11}$, a collector connected to the voltage source $V_{CC}$ and an emitter connected to a base of the transistor $Tr_3$. Further, there is provided a diode D to connect the emitter and the base of the transistor $Tr_{12}$, with the anode terminal connected to the emitter of the transistor $Tr_{12}$ and the cathode terminal connected to the base of the transistor $Tr_{12}$.

Similarly, there is provided an NPN transistor $Tr_{13}$ having a base connected to an input terminal $T_{i2}$ via a resistor $R_2$ for receiving the input signal $\overline{D}$, a collector connected to the voltage source $V_{CC}$ via a constant current source 3b, and an emitter connected to the ground. The transistor $Tr_{13}$ drives the transistor $Tr_4$ via an NPN transistor $Tr_{15}$ that forms a Darlington's connection with the transistor $Tr_4$. Thus, the transistor $Tr_{15}$ has a collector connected to the collector of the transistor $Tr_4$, an emitter connected to the base of the transistor $Tr_4$ and a base connected to the collector of the transistor $Tr_{13}$. Further, the collector of the transistor $Tr_{15}$ is connected to the emitter of the transistor $Tr_{12}$ via a resistor R1 and the emitter of the transistor $Tr_{15}$ is connected to the ground via a resistor R5. In addition to the drive transistor $Tr_{13}$, there is provided another drive transistor $Tr_{14}$ that has a base connected to the input terminal $T_{i2}$ via a resistor R3, a collector connected to the base of the transistor $Tr_4$ and an emitter connected to the ground $V_{EE}$.

A similar construction is provided for the drive part 2b, wherein transistors $Tr_{21}$–$Tr_{25}$ are provided in correspondence to the transistors $Tr_{11}$–$Tr_{15}$, respectively.

Thus, the second drive part 2b includes an NPN transistor $Tr_{21}$ having a base connected to the input terminal $T_{i3}$ for receiving the input signal D a collector connected to the voltage source $V_{CC}$ via a constant current source 3a and an emitter connected to the ground $V_{EE}$. The transistor $Tr_{21}$ drives the transistor $Tr_5$ via an NPN transistor $Tr_{22}$ that forms a Darlington's pair with the transistor $Tr_5$. There, the transistor $Tr_{22}$ has a base connected to the collector of the transistor $Tr_{21}$, a collector connected to the voltage source $V_{CC}$ and an emitter connected to a base of the transistor $Tr_5$. Further, there is provided a diode D to connect the emitter and the base of the transistor $Tr_{22}$, with the anode terminal connected to the emitter of the transistor $Tr_{22}$ and the cathode terminal connected to the base of the transistor $Tr_{22}$.

Similarly, there is provided an NPN transistor $Tr_{23}$ having a base connected to an input terminal $T_{i4}$ via a resistor R7 for receiving the input signal D, a collector connected to the voltage source $V_{CC}$ via a constant current source 3b, and an emitter connected to the ground. The transistor $Tr_{23}$ drives the transistor $Tr_6$ via an NPN transistor $Tr_{25}$ that forms a Darlington's connection with the transistor $Tr_6$. Thus, the transistor $Tr_{25}$ has a collector connected to the collector of the transistor $Tr_6$, an emitter connected to the base of the transistor $Tr_6$ and a base connected to the collector of the transistor $Tr_{23}$. Further, the collector of the transistor $Tr_{25}$ is connected to the emitter of the transistor $Tr_{22}$ via a resistor R6 and the emitter of the transistor $Tr_{25}$ is connected to the ground via a resistor R9. In addition to the drive transistor $Tr_{23}$, there is provided another drive transistor $Tr_{24}$ that has a base connected to the input terminal $t_{i4}$ via a resistor R8, a collector connected to the base of the transistor $Tr_6$ and an emitter connected to the ground $V_{EE}$.

In order to achieve the object of the present invention and avoid the simultaneous turning on of the power MOS transistors $Tr_1$ and $Tr_2$, there is provided a bipolar transistor $Tr_{18}$ having a base connected to the base of the transistor $Tr_{15}$ via a resistor R4. The transistor $Tr_{18}$ further has a collector connected to the voltage source $V_{CC}$ via a constant current source 3c and an emitter connected to the ground. Thereby, the transistor $Tr_{18}$ is turned on in response to the base voltage of the transistor $Tr_{15}$, and the level of the collector of the transistor $Tr_{18}$ is lowered with a delay pertinent to the operation of the transistor $Tr_{18}$. The transistor $Tr_{18}$ in turn drives another NPN transistor $Tr_{17}$ that has a base connected to the collector of the transistor $Tr_{18}$, a collector connected to the base of the transistor $Tr_{22}$ and an emitter connected to the ground. Thereby, the transistor $Tr_{17}$ is turned off when the transistor $Tr_{18}$ is turned on and turned on when the transistor $Tr_{18}$ is turned off. When turned on, the transistor $Tr_{17}$ absorbs the base current of the transistors $Tr_{22}$ and $Tr_5$ either directly or via the diode D, and the transistors $Tr_{22}$ and $Tr_5$ are both turned off irrespective of whether the voltage level at the collector of the transistor $Tr_{21}$ is high or not.

Similarly, the drive part 2b includes a bipolar transistor $Tr_{28}$ having a base connected to the base of the transistor $Tr_{25}$ via a resistor R10. The transistor $Tr_{28}$ further has a collector connected to the voltage source $V_{CC}$ via a constant current source 3c' and an emitter connected to the ground. Thereby, the transistor $Tr_{28}$ is turned on in response to the base voltage of the transistor $Tr_{25}$, and the level of the collector of the transistor $Tr_{28}$ is lowered with a delay pertinent to the operation of the transistor $Tr_{28}$. The transistor $Tr_{28}$ in turn drives another NPN transistor $Tr_{27}$ that has a base connected to the collector of the transistor $Tr_{28}$, a collector connected to the base of the transistor $Tr_{12}$ and an emitter connected to the ground. Thereby, the transistor $Tr_{27}$ is turned off when the transistor $Tr_{26}$ is turned on and turned on when the transistor $Tr_{26}$ is turned off. When turned on, the transistor $Tr_{27}$ absorbs the base current of the transistors $Tr_{12}$ and $Tr_3$ either directly or via the diode D, and the transistors $Tr_{12}$ and $Tr_3$ are both turned off irrespective of whether the voltage level at the collector of the transistor $Tr_{11}$ is high or not.

Figure 6A:
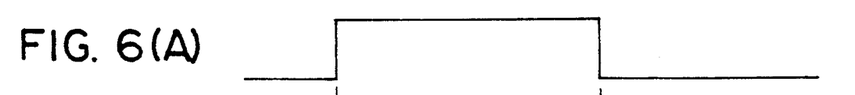
FIGS. 6(A)–6(J) are diagrams showing the timing of operation of various transistors in the circuit of FIG. 5.
Figure 6B:
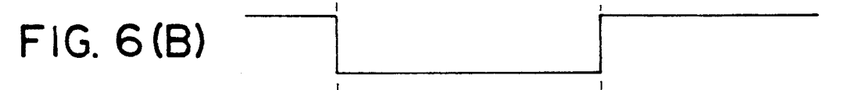
Figure 6C:
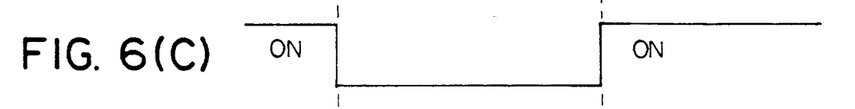

FIGS. 6(A)–6(J) show the timing of the foregoing operation for various parts of the circuit 10, wherein FIG. 6(A) shows the input data D supplied to the input terminals $T_{i1}$ and $T_{i4}$ while FIG. 6(B) shows the input data D supplied to the input terminals $T_{i2}$ and $T_{i3}$ FIG. 6(C). on the other hand shows the timing of turning-off and turning-on of the transistors $Tr_{25}$ and $Tr_6$ caused in response to the signal D at the input terminal $T_{i4}$. As can be seen in FIG. 6(C), the turning-off and turning-on of the transistors $Tr_{25}$ and $Tr_6$ occur substantially coincident to the rising edge and the falling edge of the input signal D, respectively.

Figure 6D:
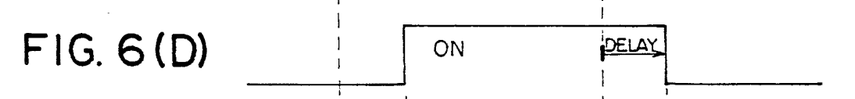

FIG. 6(D), on the other hand, shows the timing of the turning-on and turning-off of the transistor $Tr_{27}$ that are caused in response to the base voltage of the transistor $Tr_{25}$. As will be noted in FIG. 6(D), there appears a delay in the turning-on and turning-off of the transistor $Tr_{27}$, and such a delay is caused by the delay in the operation of the transistor $Tr_{28}$ that detects the base voltage of the transistor $Tr_{25}$ and drives the transistor $Tr_{27}$. When the input signal D has returned to the low level in corresponding to the trailing edge of the waveform of FIG. 6(A), the transistor $Tr_{23}$ is turned off and the voltage level at the collector of the transistor $Tr_{23}$ becomes high. In response thereto, the transistor $Tr_{28}$ is turned on and the transistor $Tr_{27}$ is turned off after a delay as shown in FIG. 6(D).

Figure 6E:
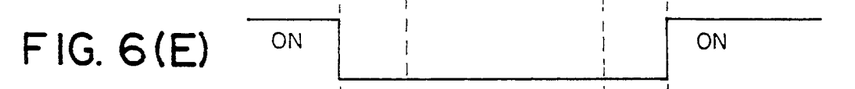
Figure 6F:
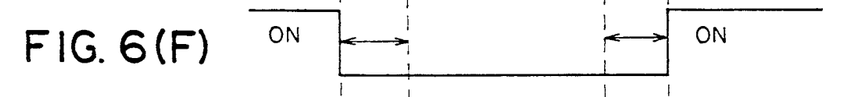

As the transistor $Tr_{27}$ diverts the base current of the transistors $Tr_{12}$ and $Tr_3$ to the ground when turned on, the transistors $Tr_{12}$ and $Tr_3$, being turned off in response to the high level state of the input signal D, remains in the turned-off state for a while as shown in FIG. 6(E), even when the input signal D has returned to the low level state at the trailing 10 edge of FIG. 6(A). Thereby, the turning-on of the power MOS transistor $Tr_1$ does not occur until the transistors $Tr_{12}$ and $Tr_3$ are turned on in response to the turning-off of the transistor $Tr_{27}$ as shown in FIG. 6(F). It should be noted that the transistor $Tr_1$ is turned off immediately in response to the rising edge of the input signal D of FIG. 6(A) in coincidence with the falling edge of the input signal D as shown in FIG. 6(F) under the control of the transistors $Tr_{13}$–$Tr_{15}$ and the transistor $Tr_4$.

Figure 6G:
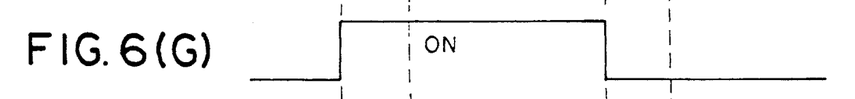
Figure 6H:
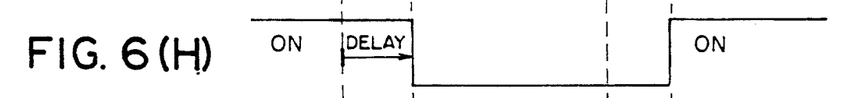

FIG. 6(G) shows the state of the transistors $Tr_{15}$ and $Tr_4$. As can be seen, the turning-on and turning-off of these transistors occur substantially in synchronization with the input signals D and $\overline{D}$ of FIGS. 6(A) and 6(B). FIG. 6(H), on the other hand, shows operation of the transistor $Tr_{17}$ that is caused in response to the base voltage of the transistor $Tr_{15}$. As can be seen in FIG. 6(H), there appears a delay in the operation of the transistor $Tr_{17}$ with respect to the signals D and $\overline{D}$ of FIGS. 6(A) and 6(B) due to the delay in the operation of the transistor $Tr_{16}$ that actually drives the transistor $Tr_{17}$.

Figure 6I:
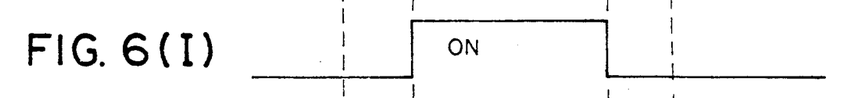
Figure 6J:
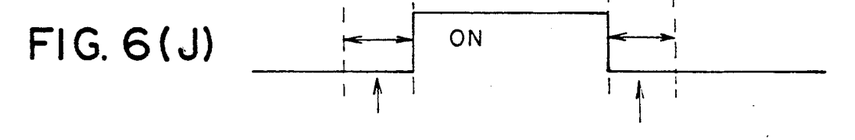

FIG. 6(I) shows the operation of the transistors $Tr_{22}$ and $Tr_5$ that is caused in response to the input signal D at the input terminal $T_{i3}$ As shown in FIG. 6(I), the transistors $Tr_{22}$ and $Tr_5$ are held in the turned-off state as long as the transistor $Tr_{17}$ is turned on. First when the transistor $Tr_{17}$ is turned off, the transistors $Tr_{22}$ and $Tr_5$ are turned on, and turned off subsequently in response to the rising edge of the signal D of FIG. 6(B). In response to the operation of the transistors $Tr_{22}$ and $Tr_5$, the power MOS transistor $Tr_2$ is turned on and turned off as shown in FIG. 6(J). By comparing FIG. 6(F) showing the operation of the power MOS transistor $Tr_1$ and FIG. 6(J) showing the operation of the power MOS transistor $Tr_2$, one can see that there appears an interval wherein both the transistors $Tr_1$ and $Tr_2$ are turned off in correspondence to the delay caused by the transistors $Tr_{18}$ and $Tr_{28}$, and the simultaneous turning on of the power MOS transistors $Tr_1$ and $Tr_2$ is eliminated as explained with reference to FIG. 3.

Figure 7:
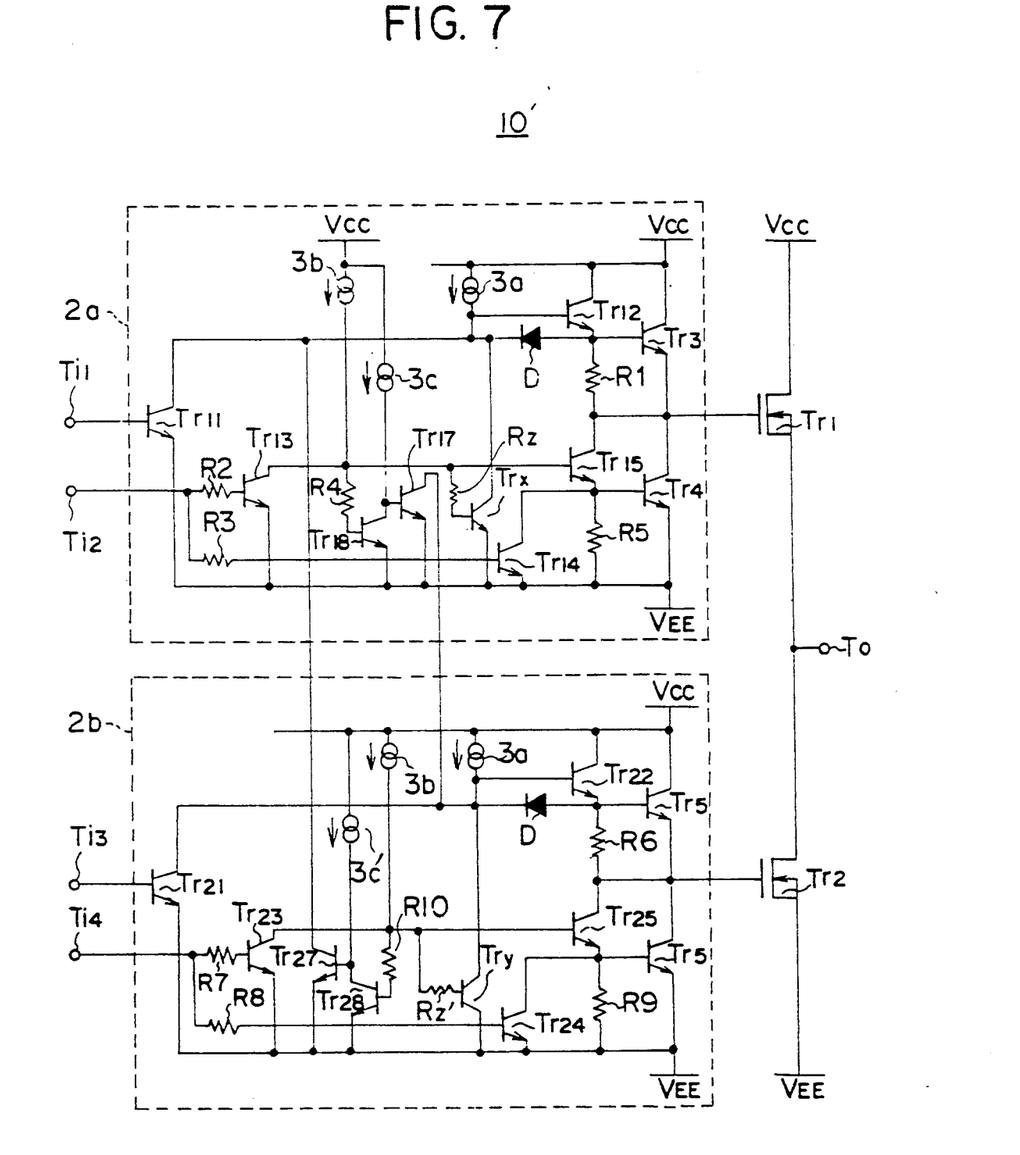
FIG. 7 is a circuit diagram showing a modification of the first embodiment.

FIG. 7 shows a modification of the circuit of FIG. 5 wherein the feed-through current within the drive parts 2a and 2b is eliminated.

In the modification of FIG. 7, there is provided an NPN transistor Trx between the base of the transistor $Tr_{12}$ and the ground for absorbing the base current when turned on. The transistor Trx has a base connected to the base of the transistor $Tr_{15}$ and driven in response to the base voltage of the transistor $Tr_{15}$. In other words, the transistor Trx is turned on when transistor $Tr_{15}$ is turned on. Thus, in response to the turning on of the transistor $Tr_{15}$, the transistor Trx absorbs the base current of the transistor $Tr_{12}$ and hence the base current of the transistor $Tr_3$ and the simultaneous turning-on of the transistors $Tr_{12}$ and $Tr_{15}$ is positively eliminated. Thereby, the feed-through current through the transistors $Tr_{12}$ and $Tr_{15}$ is eliminated and the power consumption of the system is further improved.

Figure 8:
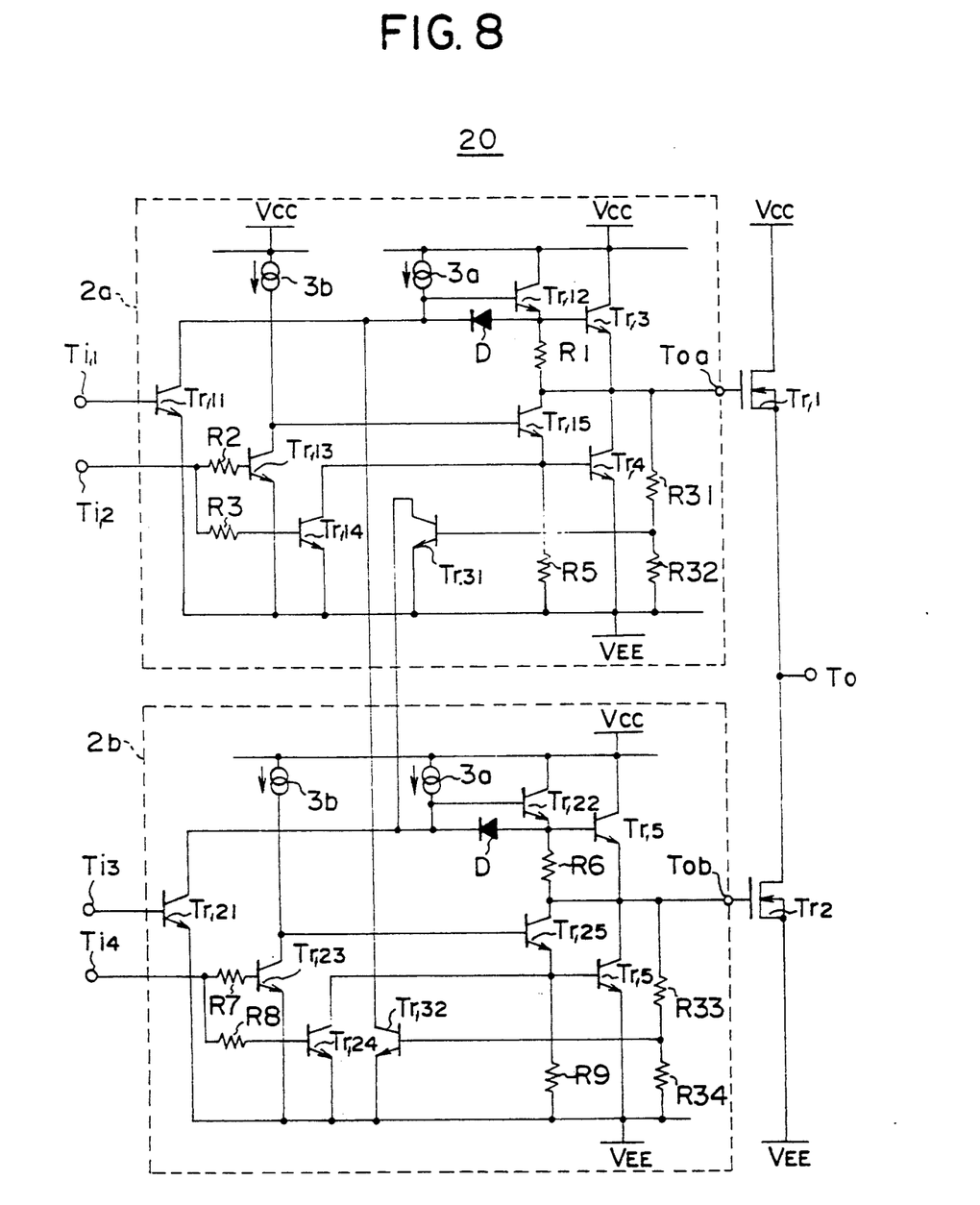
FIG. 8 is a detailed circuit diagram showing the driver circuit according to the second embodiment of the present invention.

FIG. 8 shows the detailed circuit diagram for the second embodiment corresponding to FIG. 4.

In this circuit, the gate voltage of the MOS transistor $Tr_1$ is detected by an NPN transistor $Tr_{31}$ via a voltage divider circuit that includes a series connection of resistors $R_{31}$ and $R_{32}$. The transistor $Tr_{31}$ has a collector connected to the base of the transistor $Tr_{22}$ and an emitter connected to the ground. Thus, in response to the increase in the gate voltage of the MOS transistor $Tr_1$ that causes the MOS transistor $Tr_1$ to turn on, the transistor $Tr_{31}$ is turned on and turns off the transistors $Tr_{22}$ and $Tr_5$, and hence the power MOS transistor $Tr_2$. Similarly, there is provided an NPN transistor $Tr_{32}$ that detects the gate voltage of the MOS transistor $Tr_2$ via a voltage divider circuit that includes a series connection of resistors $R_{33}$ and $R_{34}$. The transistor $Tr_{32}$ has a collector connected to the base of the transistor $Tr_{12}$ and an emitter connected to the ground and turns off the transistors $Tr_{12}$ and $Tr_3$ and hence the transistor $Tr_1$ in response to the increased gate voltage of the transistor $Tr_2$.

Figure 9A:
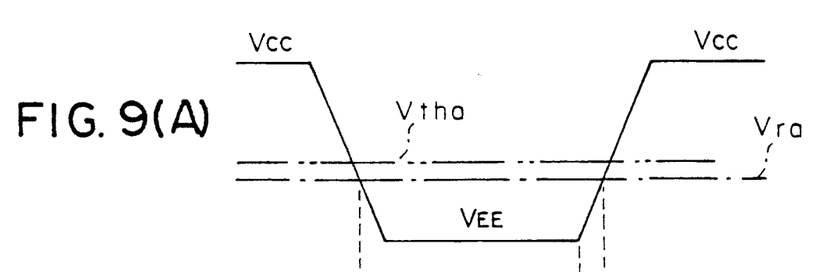
FIGS. 9(A)–9(D) are diagrams showing the timing of operation of various transistors in the circuit of FIG. 8.
Figure 9B:
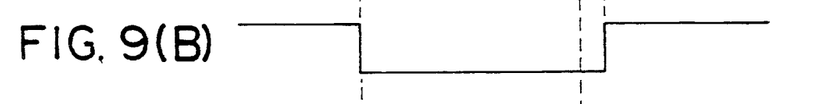
Figure 9C:
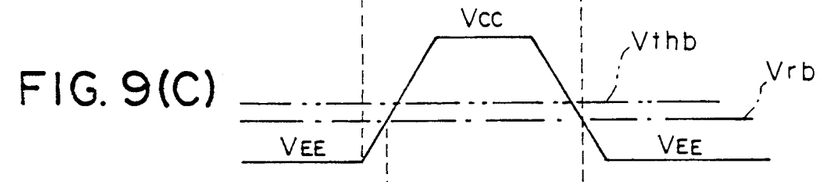
Figure 9D:
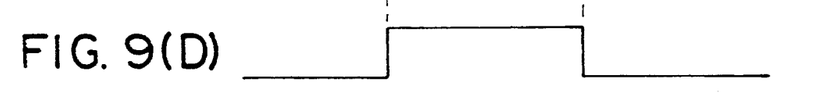

FIGS. 9(A)–9(D) show the timing of operation of the circuit of FIG. 8, wherein FIG. 9(A) shows the transition of the gate voltage of the power MOS transistor $Tr_1$ detected at a node TOa while FIG. 9(C) shows the transition of the gate voltage of the power MOS transistor $Tr_2$ detected at a node TOb. In FIG. 9(A), the threshold level for the turning-on and turning-off of the power MOS transistor $Tr_1$ is represented by VTHA. Similarly, the threshold level of the power MOS transistor $Tr_2$ is represented in FIG. 9(C) by VTHB There, the threshold level for the operation of the transistor $Tr_{31}$ is set lower than the threshold level of the MOS transistor $Tr_1$ as shown in FIG. 9(A) by a line $V_{ra}$. Similarly, the threshold level for the operation of the transistor $Tr_{32}$ is set lower than the threshold level of the MOS transistor $Tr_2$ as shown in FIG. 9(C) by a line $V_{rb}$. Thereby, the transistor $Tr_{31}$ is turned on with the transition of the voltage level at the node TOa from the low level ($V_{EE}$) to the high level ($V_{CC}$) before the transistor $Tr_1$ is turned on, as shown by the rising edge of the waveform of FIG. 9(B) that shows the operation of the transistor $Tr_{31}$. Similarly, when the voltage level at the node TOb increases from the low level ($V_{EE}$) to the high level ($V_{CC}$), the transistor $Tr_{32}$ is turned on first as shown by the rising edge of FIG. 9(D) showing the operation of the transistor $Tr_{32}$, and the turning-on of the power MOS transistor Tr$_2$ occurs after the transistor Tr$_{32}$ has turned on.

As long as the transistor Tr$_{32}$ is turned on, the turning-on of the power MOS transistor Tr$_1$ is prohibited. Thus, the transistor Tr$_1$ is turned off by the transistor Tr$_{32}$ before the transistor Tr$_2$ is turned on. Similarly, as long as the transistor Tr$_{31}$ is turned on, the turning-on of the power MOS transistor Tr$_2$ is prohibited. Thus, the transistor Tr$_2$ is turned off by the transistor Tr$_{31}$ before the transistor Tr$_1$ is turned on. Thereby, the simultaneous turning-on of the power MOS transistors Tr$_1$ and Tr$_2$, that may occur in the actual circuit due to the variation in the circuit constants or threshold of the transistors, is positively prevented, and the problem of waste current flowing through the transistors Tr$_1$ and Tr$_2$ is eliminated.

Figure 10:
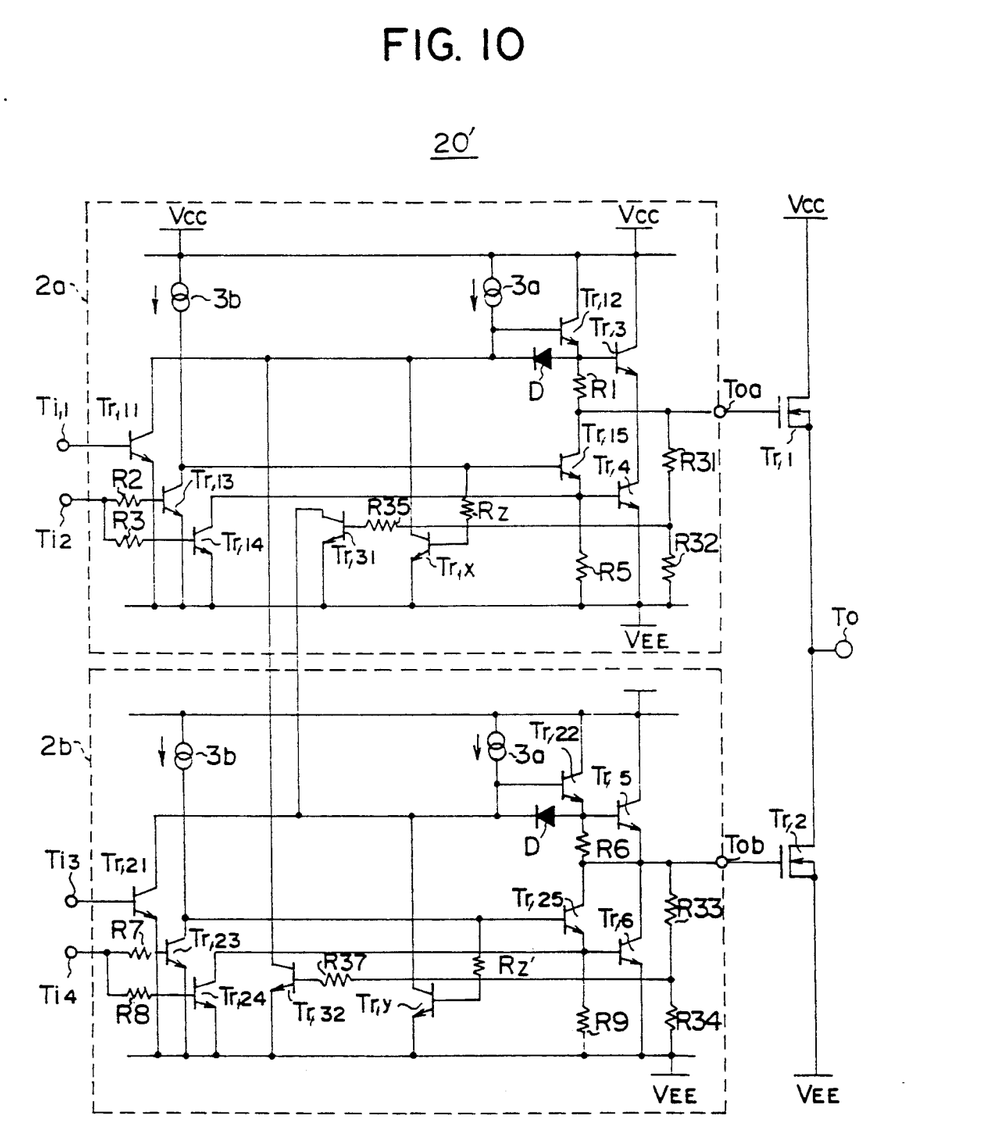
FIG. 10 is a modification of the circuit of FIG. 8.

FIG. 10 shows a modification of the circuit of FIG. 8 for eliminating the feed-through current in the drive parts 2a and 2b. In this circuit, too, the NPN transistor Trx is provided similar to the circuit of FIG. 7. Thereby, one can improve the power consumption of the output circuit further, although the effect of the improvement appears more significant by preventing the simultaneous turning-on of the power MOS transistors Tr$_1$ and Tr$_2$ as set forth in the first and second embodiments.

By using the output circuit of any of FIGS. 5, 7, 8 and 9, one can reduce the power consumption of the digital audio system of FIG. 1 and improve the quality of the sound obtained form the system. Further, the application of the present output circuit is by no means limited to the digital audio systems. For example, the present invention may be used for driving electric motors or electromagnetic actuators with the similar preferable effect of reduced power consumption.

Further, the present invention is not limited to the embodiments described heretofore, but various variations and modifications may be made without departing from the scope of the invention.

What is claimed is:

1. An output circuit supplied with an input digital signal for producing an output digital signal with an increased output power, comprising:

a first input terminal for receiving an input logic signal that assumes alternately a first logic level and a second, lower logic level;

a second input terminal for receiving a logic inversion of the input logic signal;

first and second transistors connected in series between a first voltage source that provides a first drive voltage and a second voltage source that provides a second, different drive voltage, said first and second transistors being supplied with the input logic signal and the logic inversion thereof respectively from the first and second input terminals and turned on and turned off in response thereto;

third and fourth transistors connected in series between a third voltage source that provides a third drive voltage and a fourth voltage source that provides a fourth drive voltage that is different from the third voltage, said third and fourth transistors being supplied with the logic inversion of the input logic signal and the input logic signal, respectively, from the second and first input terminals and turned on and turned off in response thereto;

said first and second transistors being turned on and turned off in response to the input logic signal and the logic inversion thereof such that when the first transistor is turned on, the second transistor is turned off and when the second transistor is turned off, the first transistor is turned on;

said third and fourth transistors being turned on and turned off in response to the input logic signal and the logic inversion thereof such that when the third transistor is turned on, the fourth transistor is turned off and when the third transistor is turned off, the fourth transistor is turned on;

first and second power transistors connected in series between a fifth voltage source that provides a fifth drive vol&age and a sixth voltage source that provides a sixth drive voltage that is different from the fifth drive voltage, said first power transistor being turned on in response to the turning-on of the first transistor and turned off in response to the turning-on of the second transistor, said second power transistor being turned on in response to the turning-on of the third transistor and turned off in response to the turning-on of the fourth transistor;

a first drive control circuit for detecting the turning-on and turning-off of the second power transistor and disabling the turning-on of the first transistor in response to the turning-on of the second power transistor with a delay such that the turning-on of the first transistor is prohibited for a predetermined interval even after the second power transistor is turned on following a turned-off state; and a second drive control circuit for detecting the turning-on and turning-off of the first power transistor and disabling the turning-on of the third transistor in response to the turning-on of the first power transistor with a delay such that the turning-on of the third transistor is prohibited for a predetermined time interval even after the first power transistor is turned on following a turned-off state.

2. An output circuit as claimed in claim 1 in which said first transistor comprises a first bipolar transistor having a collector connected to the first voltage source, an emitter, and a base that is supplied with the input digital signal from the first input terminal, said second transistor comprises a second bipolar transistor having a collector connected to the emitter of the first bipolar transistor, an emitter connected to the second voltage source and a base supplied with the logic inversion of the input digital signal from the second input terminal, said third transistor comprises a third bipolar transistor having a collector connected to the third voltage source, an emitter and a base that is supplied with the logic inversion of the input digital signal from the second input terminal, said fourth transistor comprises a fourth bipolar transistor having a collector connected to the emitter of the third bipolar transistor, an emitter connected to the fourth voltage source, and a base supplied with the logic signal of the input digital signal from the first input terminal, said first power transistor comprises a first MOS transistor having a drain connected to the fifth voltage source, a gate connected to the emitter of the first bipolar transistor, and a source, said second power transistor comprises a second MOS transistor having a drain connected to the source of the first MOS transistor, a gate connected to the emitter of the third bipolar transistor, and a source connected to the sixth voltage source, said first drive control circuit comprises a fifth bipolar transistor having a collector connected to the base of the first bipolar transistor and an emitter connected to the second voltage source, and said second drive control circuit comprises a sixth bipolar transistor having a collector connected to the base of the third bipolar transistor and an emitter connected to the fourth voltage source.

3. An output circuit as claimed in claim 2 in which said first drive control circuit further comprises a first delay circuit supplied with an input signal from the base of the fourth bipolar transistor and supplying a drive current to a base of the fifth bipolar transistor such that the first bipolar transistor is turned off by the fifth bipolar transistor after the fourth bipolar transistor is turned on and such that the first bipolar transistor is allowed to be turned on after the fourth bipolar transistor is turned on, with a delay pertinent to the first delay circuit, said second drive control circuit further comprises a second delay circuit supplied with an input signal from the base of the second bipolar transistor and supplying a drive current to a base of the sixth bipolar transistor such that the third bipolar transistor is turned off by the sixth bipolar transistor after the second bipolar transistor is turned on and such that the third bipolar transistor is allowed to turn on after the second bipolar transistor is turned on, with a delay pertinent to the second delay circuit.

4. An output circuit as claimed in claim 3 in which said first and second delay circuit comprise an inverter for producing the drive current as a logic inversion of the input signal supplied thereto.

5. An output circuit as claimed in claim 4 in which said first delay circuit comprises a seventh bipolar transistor having a base connected to the base of the fourth bipolar transistor, a collector connected to the base of the fifth bipolar transistor and an emitter connected to the fourth voltage source, and said second delay circuit comprises an eighth bipolar transistor having a base connected to the base of the second bipolar transistor, a collector connected to the base of the sixth bipolar transistor and an emitter connected to the second voltage source.

6. An output circuit as claimed in claim 2 in which said first drive control circuit further comprises first voltage detection means connected to the gate of the first MOS transistor for detecting a gate voltage thereof, said first voltage detection means supplying the detected gate voltage to the base of the sixth bipolar transistor, said second drive control circuit further comprises second voltage detection means connected to the gate of the second MOS transistor for detecting a gate voltage thereof, said second voltage detection means supplying the detected gate voltage to the base of the fifth bipolar transistor, said fifth bipolar transistor having a threshold level set such that the fifth bipolar transistor is turned on before the second MOS transistor is turned on, said sixth bipolar transistor having a threshold level set such that the sixth bipolar transistor is turned on before the first MOS transistor is turned on.

7. An output circuit as claimed in claim 6 in which said first voltage detection means comprises a voltage divider connected between the gate of the first MOS transistor and the second voltage source, said second voltage detection means comprises a voltage divider connected between the gate of the second MOS transistor and the fourth voltage source.

8. An output circuit as claimed in claim 7 in which said first, third and fifth voltage sources comprise a common voltage source that provides a first predetermined voltage as the first, third and fifth voltages, said second, fourth and sixth voltage sources comprise a common voltage source that provides a second predetermined voltage as the second, fourth and sixth voltages.

9. An output circuit as claimed in claim 2 in which each of said first, second, third and fourth bipolar transistors comprise a pair of bipolar transistors coupled to form the Darlington's pair.

* * * * *

UNITED STATES PATENT AND TRADEMARK OFFICE
CERTIFICATE OF CORRECTION

PATENT NO. : 5,121,011
DATED : June 9, 1992
INVENTOR(S) : Eiji OHYA et al.

It is certified that error appears in the above-identified patent and that said Letters Patent is hereby corrected as shown below:

Col. 1,  line 61, change "$T_{r3}$" to --$Tr_3$--;
line 63, change "$T_{r4}$" to --$Tr_4$--.

Col. 3,  line 53, delete "IU";
line 62, change "&transistors" to --transistors--.

Col. 4,  line 54, change "object" to --objects--.

Col. 5,  line 61, before "$Tr_2$" insert --$Tr_6$ is turned on immediately and the power MOS transistor--.

Col. 9,  line 3, after "$T_{i3}$" insert --.--;
line 4, change "." to --;--; and after "hand" insert --,--;
line 32, delete "10";
line 55, after "$T_{i3}$" insert --.--.

Col. 10, line 50, change "VTHA" to --$V_{THA}$--;
line 52, change "VTHB" to --$V_{THB}$--.

Col. 11, line 30, change "form" to --from--.

Signed and Sealed this

Fifteenth Day of March, 1994

BRUCE LEHMAN

Attest:

Attesting Officer

Commissioner of Patents and Trademarks